(12) United States Patent
Kim et al.

(10) Patent No.: US 9,117,963 B2
(45) Date of Patent: Aug. 25, 2015

(54) SOLAR CELL

(75) Inventors: Sungjin Kim, Changwon-si (KR);
Taeyoung Kwon, Changwon-si (KR);
Seongeun Lee, Changwon-si (KR);
Gyeayoung Kwag, Changwon-si (KR)

(73) Assignee: LG ELECTRONICS INC., Seoul (KR)

( * ) Notice: Subject to any disclaimer, the term of this patent is extended or adjusted under 35 U.S.C. 154(b) by 281 days.

(21) Appl. No.: 13/312,028

(22) Filed: Dec. 6, 2011

(65) Prior Publication Data

US 2012/0138141 A1 Jun. 7, 2012

(30) Foreign Application Priority Data

Dec. 6, 2010 (KR) .................. 10-2010-0123692

(51) Int. Cl.
*H01L 31/042* (2014.01)
*H01L 31/18* (2006.01)
*H01L 31/0224* (2006.01)

(52) U.S. Cl.
CPC .... *H01L 31/1804* (2013.01); *H01L 31/022433* (2013.01); *Y02E 10/547* (2013.01)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| 2007/0186968 A1* | 8/2007 | Nakauchi et al. ............. 136/244 |
| 2010/0018562 A1* | 1/2010 | Kurahashi et al. ............ 136/244 |
| 2011/0247688 A1* | 10/2011 | Yoon et al. ..................... 136/256 |
| 2011/0277835 A1* | 11/2011 | Masson et al. ................ 136/256 |

FOREIGN PATENT DOCUMENTS

KR WO2010030109 * 3/2010

* cited by examiner

*Primary Examiner* — Bach Dinh
(74) *Attorney, Agent, or Firm* — Birch, Stewart, Kolasch & Birch, LLP

(57) ABSTRACT

A solar cell includes a photoelectric conversion layer and a front electrode on the photoelectric conversion layer. The front electrode includes a bus bar electrode; at least one first finger electrode directly connected to the bus bar electrode; a plurality of connecting electrodes extending from the bus bar electrode and having a width smaller than a width of the bus bar electrode, wherein the plurality of connecting electrodes includes portions that are spaced apart from each other to form a space therebetween; at least one second finger electrode connected to at least one of the plurality of connecting electrodes; and an auxiliary electrode formed at the space between the portions of the plurality of connecting electrodes.

16 Claims, 7 Drawing Sheets

SOLAR CELL

CROSS-REFERENCE TO RELATED APPLICATION

This application claims priority to and the benefit of Korean Patent Application No. 10-2010-0123692, filed on Dec. 6, 2010 in the Korean Intellectual Property Office, the disclosure of which is incorporated herein by reference.

BACKGROUND

1. Field of the Invention

Embodiments of the invention relate to a solar cell, and more particularly, to a solar cell having an improved electrode structure.

2. Description of the Related Art

Recently, as conventional energy resource such as petroleum and coal are expected to be exhausted and the environment is seriously polluted, significance of development in next-generation clean energy is increasing. Also, demand for renewable energy is increasing in the 21st century, and thus, interest in solar cells is also increasing. Solar cells do not pollute the environment, use a practically infinite energy resource, and can be used semi-permanently. Thus, solar cells are expected to be an energy source for solving future energy problems.

Solar cells can be largely classified into a crystalline silicon solar cell, a thin-film solar cell, and a dye-sensitized solar cell. The cost of the crystalline silicon solar cell has increased due to a short supply of a silicon raw material and a shortage of a silicon substrate induced by installing a large number of solar cell systems in recent years. For this reason, a thin-film silicon solar cell, a dye-sensitized solar cell, and a plastic solar cell are in the spotlight because their cost is low, their consumption of the raw material is less, and their supply of the raw material is stable. Despite the low cost, however, low conversion efficiency and short lifetime of the solar cells, such as the thin-film silicon solar cell, the dye-sensitized solar cell, and the plastic solar cell, are blocking the industrialization thereof. Therefore, recent studies about the solar cells are focused on techniques for improving the efficiency of the solar cells. To improve the efficiency of the solar cells, a structure or a pattern of a front electrode formed on a light incident surface of the solar cell needs to be improved.

SUMMARY OF THE INVENTION

Embodiments of the present invention are directed to a solar cell including a front electrode pattern that is able to minimize a loss of a light incident area.

A solar cell according to an embodiment of the invention includes a photoelectric conversion layer and a front electrode on the photoelectric conversion layer. The front electrode includes a bus bar electrode; at least one first finger electrode directly connected to the bus bar electrode; a plurality of connecting electrodes extending from the bus bar electrode and having a width smaller than a width of the bus bar electrode, wherein the plurality of connecting electrodes includes portions that are spaced apart from each other to form a space therebetween; at least one second finger electrode connected to at least one of the plurality of connecting electrodes; and an auxiliary electrode formed at the space between the portions of the plurality of connecting electrodes.

DETAILED DESCRIPTION OF THE EMBODIMENTS

In the following description, it will be understood that when a layer or film is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In the figures, the dimensions of layers and regions are exaggerated or schematically illustrated, or some layers are omitted for clarity of illustration. In addition, the dimension of each part as drawn may not reflect an actual size.

Hereinafter, embodiments of the invention will be described with reference to the accompanying drawings.

Figure 1:
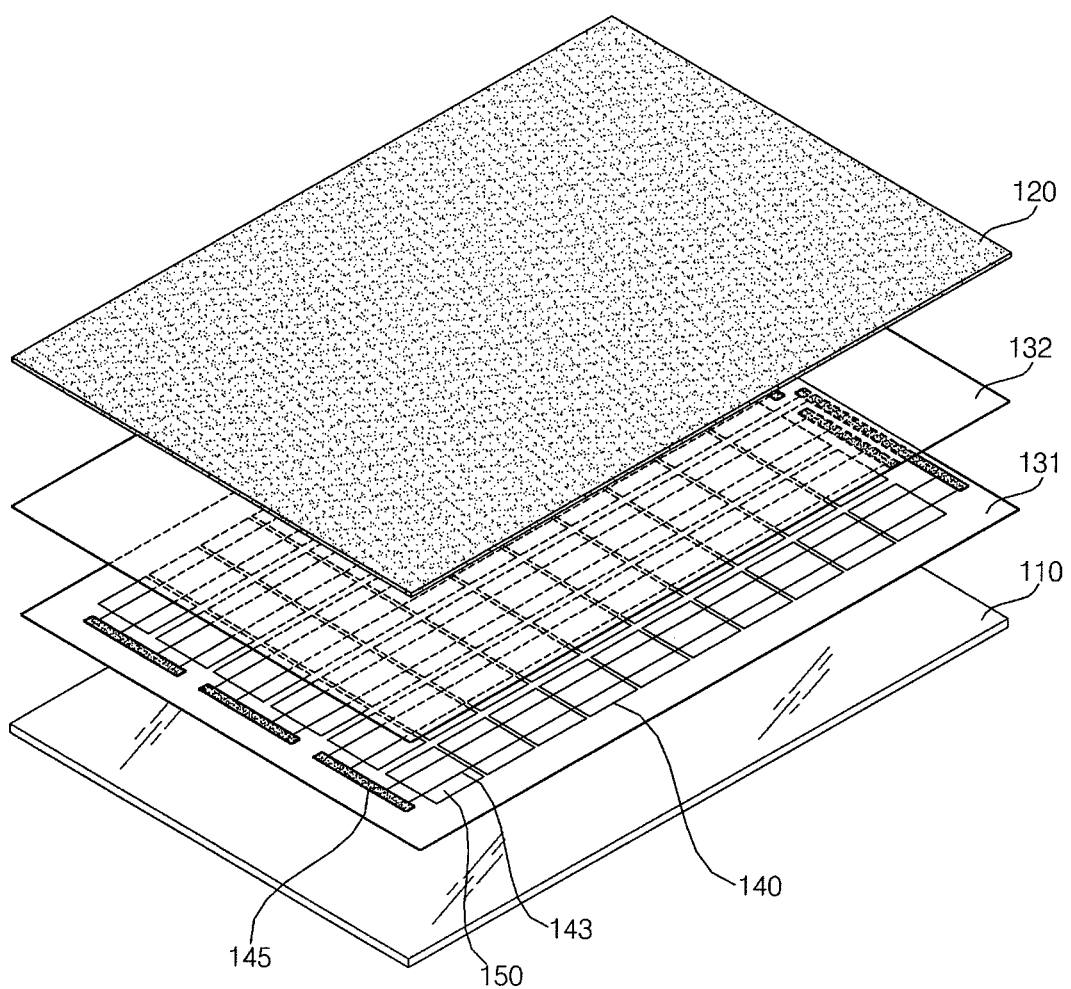
FIG. 1 is an exploded perspective view of a solar cell according to an embodiment of the invention.
Figure 2:
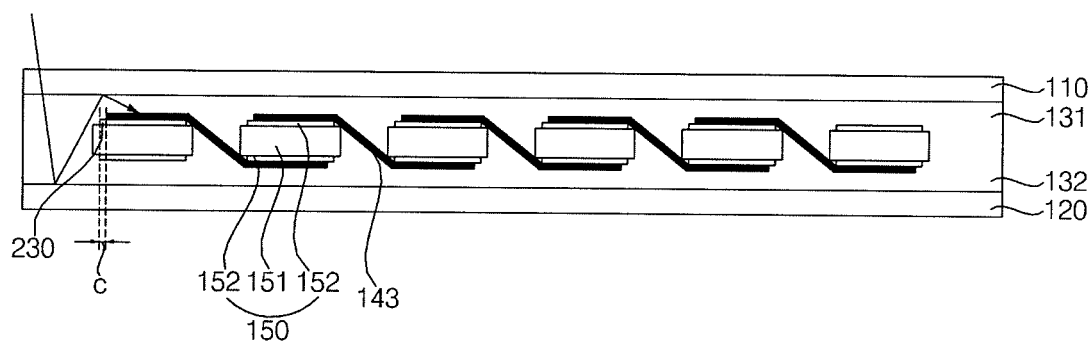
FIG. 2 is a schematic cross-sectional view of the solar cell shown in FIG. 1.

FIG. 1 is an exploded perspective view of a solar cell according to an embodiment of the invention, and FIG. 2 is a schematic cross-sectional view of the solar cell shown in FIG. 1.

Referring to FIGS. 1 and 2, a solar cell module 100 according to an embodiment of the invention includes a plurality of solar cells 150, a plurality of ribbons 143 for connecting the plurality of solar cells 150, at least one bus ribbon 145 for connecting the ribbons 143, a first sealing film 131 and a second sealing film 132 for sealing the solar cells 150 on both sides, a front substrate 110 for protecting a light incident surface of the solar cells 150, and a rear substrate 120 for protecting a rear surface of the solar cells 150.

Each solar cell 150 is a semiconductor device for converting solar energy to electric energy. Referring to FIG. 2, the solar cell 150 includes a photoelectric conversion layer 151, electrode layers 152 formed on at least one surface of the photoelectric conversion layer 151, and the ribbons 143 for connecting the solar cells 150. At an interface surface of the electrode layer 152 and the ribbon 143, a eutectic mixture may be formed. In FIG. 2, the electrode layers 152 include a front electrode layer and a rear electrode layer as an example. However, embodiments of the invention are not limited thereto. Thus, the electrode layers 152 may be formed only at the rear surface of the photoelectric conversion layer 151 in other embodiments of the invention. In this instance, the ribbon 143 connects the electrode layers 152 formed on the rear surfaces (or the rear sides) of two solar cells 150 adjacent to each other among the solar cells 150.

The photoelectric conversion layer 151 may include silicon, a compound semiconductor, or a tandem structure. In the photoelectric conversion layer 151, a P-N junction is formed, and thus, the electric energy is generated by a photoelectric effect when light, such as sun light, is incident.

The electrode layer 152 connected to a p-type layer 123 may be formed, for example, by coating a paste for an electrode including aluminum, silica, binder, and so on, on one surface on the photoelectric conversion layer 151 and heat-treating the paste. During a firing process, organic materials and a solvent included in the coated paste are removed. Upon the heat-treating, the aluminum for forming the electrode is diffused through the rear surface of the photoelectric conversion layer 151 to form a back surface field at the interface of the electrode layer 152 and the photoelectric conversion layer 151.

According to embodiments of the invention, the solar cell 150 includes the ribbon 143, and the ribbon 143 is adjacent to (or attached to) one surface of the electrode layer 152. At the interface of the electrode layer 152 and the ribbon 143, the eutectic matrix may be formed. At least an outer surface of the ribbon 143 includes at least one of Cu, Nu, Ca, Sn, Zn, In, and Sb for a eutectic bonding.

A front surface of the photoelectric conversion layer 151 may include a textured surface. Performing texturing of the front surface forms a pattern of convex-concave shapes or an uneven surface. Since the surface of photoelectric conversion layer 151 has a large roughness because of the textured surface, the reflectance of the incident light decreases and the photoelectric conversion layer 122 absorbs more light. That is, the light loss can be reduced.

Referring again to FIG. 1, the ribbon 143 may include two lines attached to an upper portion and a lower portion of the solar cells 150 in order to connect the solar cells 150. The solar cells 150 electrically connected by the ribbon 143 form a string 140. A plurality of strings 140 adjacent to each other may be arranged to form a plurality of columns.

The bus ribbon 145 is positioned where the string 140 is not formed, and is connected to the ribbon 143. The bus ribbon 145 may be connected to a lead line that is connected to a junction box for charging and discharging the electric energy and for preventing countercurrent.

Also, the bus ribbon 145 alternately connects both ends of the ribbons 143 of the strings 140, thereby electrically connecting the strings 140. The bus ribbon 145 may be arranged in a row direction at the both ends of the strings 140 arranged to form the plurality of columns. The strings 140 for forming the plurality of columns may be formed between the first sealing film 131 and the second sealing film 132.

The first sealing film 131 may be positioned on the light incident surface of the solar cells 150, and the second sealing film 132 may be positioned on the rear surface of the solar cells 150. The first sealing film 131 and the second sealing film 132 may be attached by a lamination method. The first sealing film 131 and the second sealing film 132 block moisture and oxygen that may be harmful to the solar cells 150.

In addition, the first sealing film 131 and the second sealing film 132 chemically combine elements of the solar cells 150 to each other. The first sealing film 131 and the second sealing film 132 may include an ethylene-vinyl acetate (EVA) copolymer resin, polyvinyl butyral, an ethylene-vinyl acetate having a partial oxide, a silicone resin, an ester-based resin, and/or an olefin-based resin.

The front substrate 110 is positioned on the first sealing film 131 so that the sun light can penetrate therethrough. The front substrate 110 may be formed of a transparent material, such as a tempered glass, in order to protect the solar cells 150 from an external impact. Specifically, the front substrate 110 may be a low-iron tempered glass in order to reduce or prevent the reflection of the sun light and to improve the transmissivity of the sun light.

The rear substrate 120 protects the solar cells 150 at the rear surface thereof and may be waterproof, may insulate, or may filter ultraviolet light. The rear substrate 150 may be a TPT (Tedlar/PET/Tedlar) type. However, embodiments of the invention are not limited thereto. In addition, the rear substrate 120 may include a material having a high reflectivity property in order to reuse the sun light incident through the front substrate 110, or include a material of a transparent property that allows the sun light to be incident.

Figure 3:
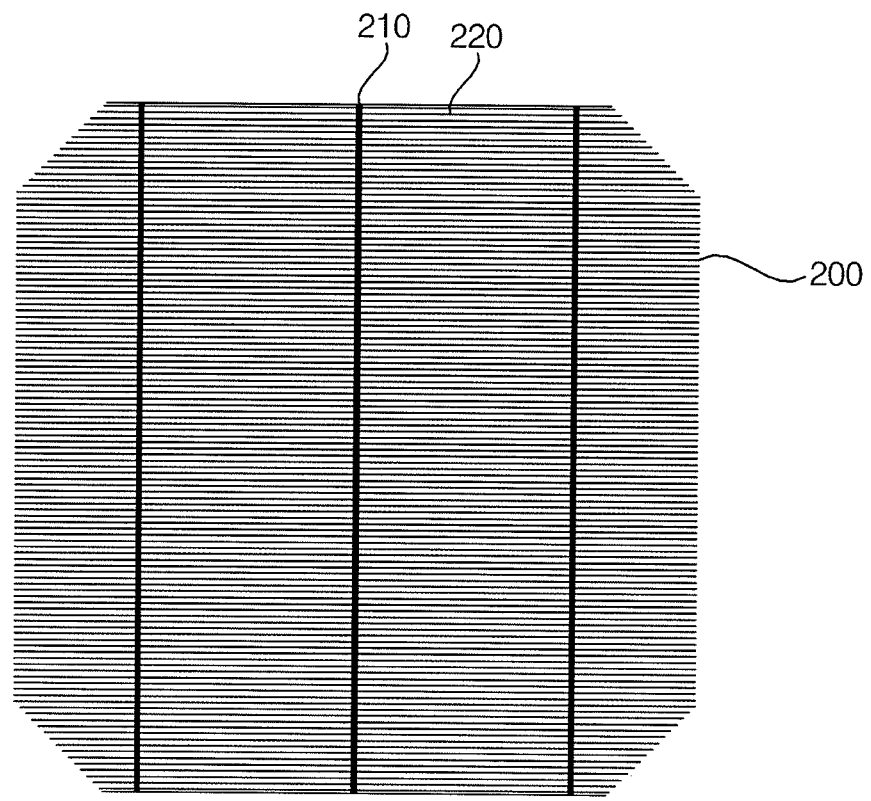
FIG. 3 is a plan view of a front electrode formed on a front portion of a typical solar cell.
Figure 4:
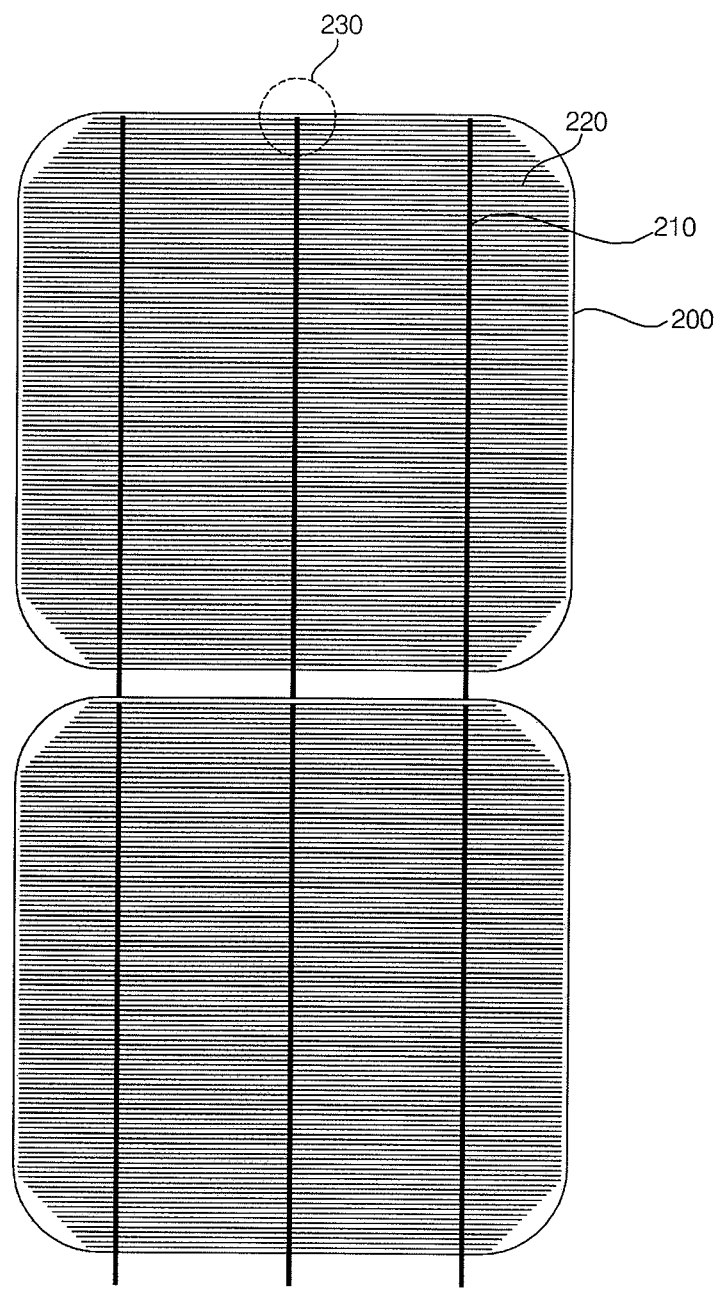
FIG. 4 is a partial view of a solar cell module formed by combining the solar cells shown in FIG. 3.

FIG. 3 is a plan view of a front electrode formed on a front portion of a typical solar cell, and FIG. 4 is a partial view of a solar cell module formed by combining the solar cells shown in FIG. 3. A solar cell 200 shown in FIGS. 3 and 4 has a typical structure. The FIGS. 3 and 4 show a front surface of the solar cell 200 where finger electrodes 220 and bus bar electrodes 210 are formed.

FIG. 3 shows a typical pattern of the front electrode. FIG. 3 shows the pattern as including the finger electrodes 220 that are densely positioned and the bus bar electrodes 210. However, such is just one example pattern of the front electrode. Thus, the front electrodes having various patterns are disclosed.

The front electrode having metal is formed on the front surface of the solar cell 200 in order to collect charges generated by the incident sun light. The front electrode includes grids that are generally referred to as the finger electrodes 220 or finger metal lines, and the bus bar electrodes 210 having a bar shape and being electrically connected to the grids as main electrodes. When the solar cell 200 generates electric energy, the electrons or the holes are collected by the bus bar electrodes 210 via the finger electrodes 220, and then, are collected by the ribbon 145.

However, since the sun light is reflected by the front electrode, and the sun light cannot penetrate the front electrode, the front electrode generates a shading loss and reduces the efficiency of the solar cell. Thus, in order to reduce the shading loss, an area of the front electrode that covers the light incident surface of the solar cell needs to be decreased. However, if the width of the finger electrodes is decreased to reduce the contact area and the shading loss, resistance of the finger electrodes may be increased due to the reduction of the cross-sectional area of the electrodes. Thus, electric loss may be increased.

That is, the front electrode on the front surface of the solar cells 200 is needed to have an optimal structure for having a high opening ratio in order to absorb more light and for minimizing the resistance and the shading loss. Typically, the width and the area of the finger electrodes 220 may be adjusted in order to improve the efficiency of the solar cells 200 by reducing the shading loss. However, the finger electrodes 220 basically have a width larger than 100 μm, and thus, the adjustment of the width and the area of the finger electrodes 220 is limited. In addition, a lithography method and a laser transfer method have been proposed in order to reduce the width of the finger electrodes 220. However, the manufacturing cost of such methods may be high.

For example, the bus bar electrodes 210 of the solar cell 200 are positioned to have a predetermined distance (about 2~3 mm) from edges of the solar cell 200, and thus, the bus bar electrodes 210 have a length of about 153 mm in a solar cell 200 having a wafer size of 156 mm. Further, the ribbon 143 connecting the solar cells and being attached thereto during manufacturing of a solar cell module have a predetermined distance (C of FIG. 2; about 2 mm) from an end of the bus bar electrode 210. Accordingly, the ribbon 143 is not attached to the solar cell at a portion 230 of the bus bar electrodes 210, and the portion 230 is a loss area for reducing the light incident area.

Figure 5:
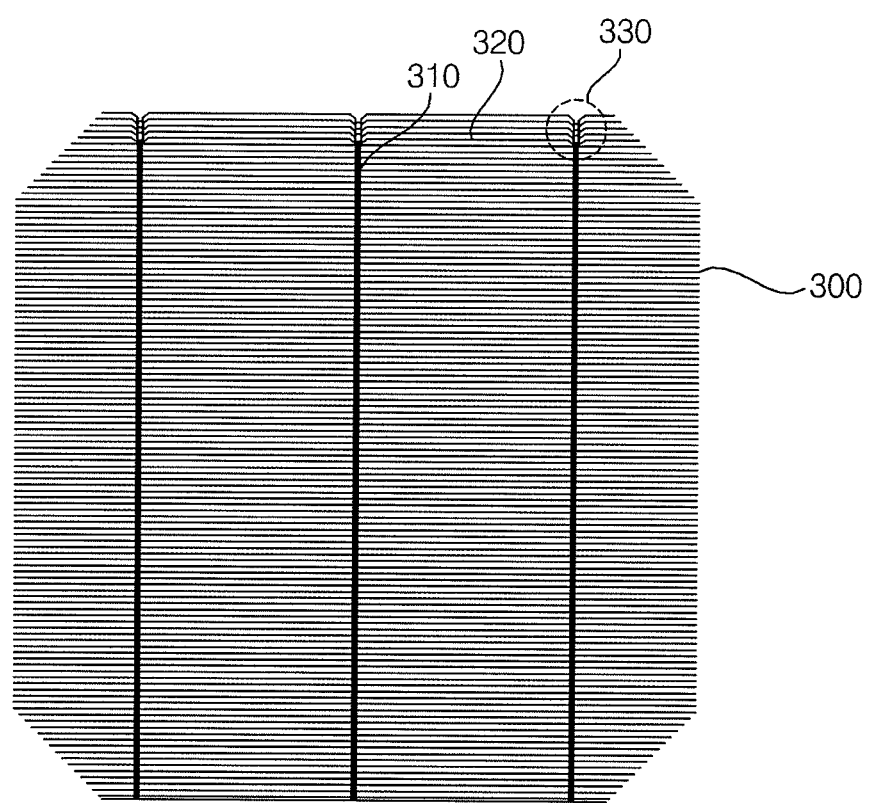
FIG. 5 is a plan view of a front electrode formed on a front portion of a solar cell according to an embodiment of the invention.
Figure 6:
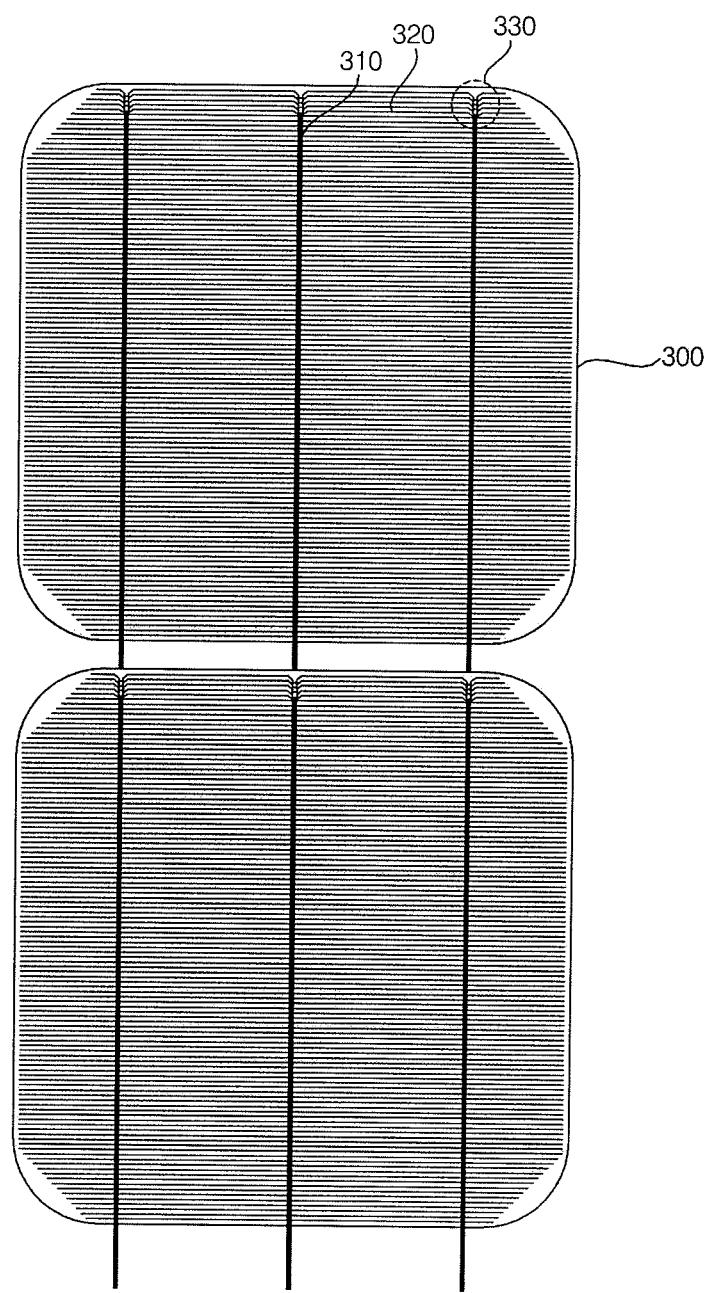
FIG. 6 is a partial view of a solar cell module formed by combining solar cells according to the embodiment of the invention.

FIG. 5 is a plan view of a front electrode formed on a front portion of a solar cell according to an embodiment of the invention, and FIG. 6 is a partial view of a solar cell module formed by combining solar cells according to the embodiment of the invention. The solar cell 300 shown in FIG. 5 according to an embodiment of the invention includes finger electrodes 320 and bus bar electrodes 310 having a structure different from those of the solar cells 200 of FIG. 4. In the solar cell according to this embodiment of the invention, the bus bar electrodes 310 have a shape for reducing loss of the light incident area.

As shown in FIG. 5, the bus bar electrode 310 is shorter than a typical bus bar electrode. That is, while the typical bus bar electrode is formed across essentially an entire light incident surface of the solar cell from one end (an upper end) to an opposite end (a lower end), an upper portion of the bus bar electrode 310 is formed differently (e.g., not formed or partially removed) in the embodiment of the invention. Thus, the sun light can penetrate the upper portion of the bus bar electrode 310 where the ribbon is not connected. Accordingly, the light incident area can increase, compared to a typical solar cell. The improved structure of the shapes of the bus bar electrodes 310 and the finger electrodes 320 are shown in FIGS. 7 to 9.

Figure 7:
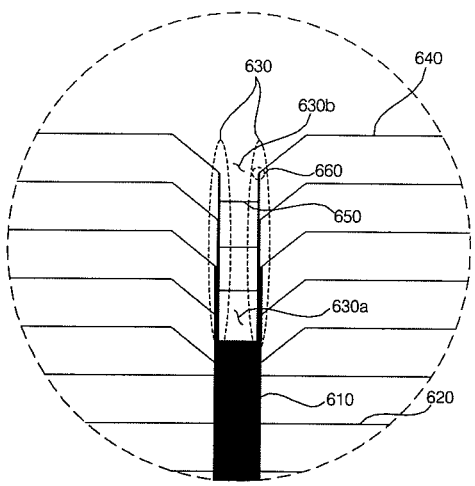
FIGS. 7 to 9 are plan views of finger electrodes and bus bar electrodes of the solar cell shown in FIG. 5.
Figure 8:
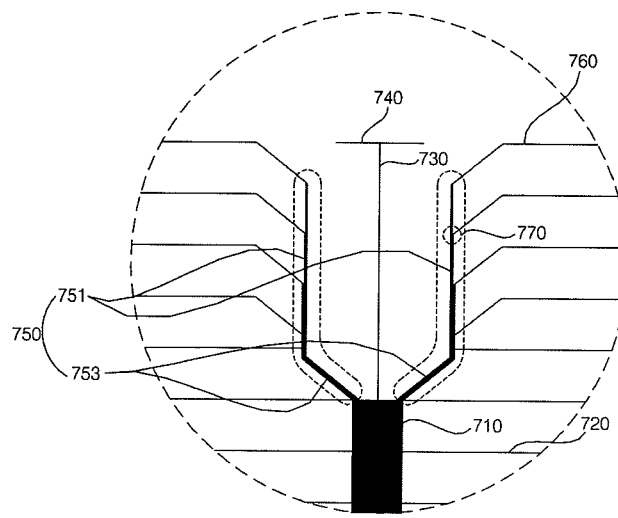
Figure 9:
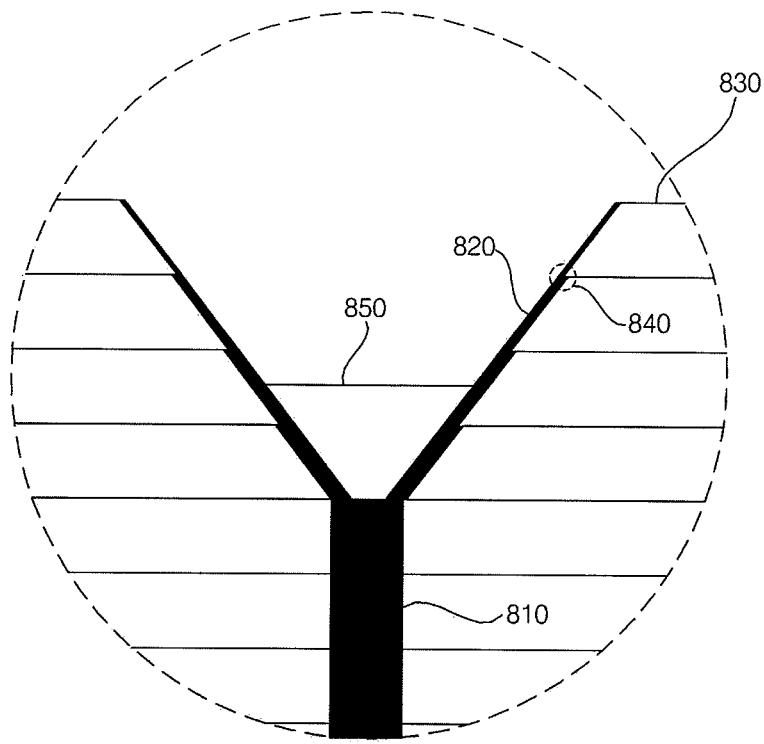

FIGS. 7 to 9 are plan views of finger electrodes and bus bar electrodes of the solar cell shown in FIG. 5. That is, FIGS. 7 to 9 are enlarged views of portions having shapes of the bus bar electrodes 310 and the finger electrodes 320 of an improved structure. Referring to FIG. 7, finger electrodes 620 and 640 are connected to a bus bar electrode 610 through connecting electrodes 630. The finger electrodes 620 and 640 include first finger electrodes 620 and second finger electrodes 640. The first finger electrodes 620 are directly connected to the bus bar electrode 610, and the second finger electrodes 640 are connected to the bus bar electrode 610 through the connecting electrodes 630. Therefore, the second finger electrodes 640 have intersections 660 with the connecting electrodes 630. The second finger electrodes 640 are positioned at the upper portion of the solar cell, that is, at the portion where the part of the bus bar electrode 610 is not formed or is removed.

Referring to FIG. 7, the bus bar electrode 610 and the connecting electrodes 630 are vertically formed (or formed parallel to each other), and the first finger electrodes 620 and the second finger electrodes 640 are horizontally formed (or formed parallel to each other). Thus, the bus bar electrode 610 and the first finger electrodes 620 intersect, and the connecting electrodes 630 and the second finger electrodes 640 have the intersections 660. The connecting electrodes 630 have a width smaller than that of the bus bar electrode 610, and thus, the area of the connecting electrodes 630 covering the light incident surface of the solar cell is small. Thus, compared to the bus bar electrode 610, the connecting electrodes 630 reduce the area generating the shading loss. The connecting electrodes 630 are formed at one end of the bus bar electrode 610 (specifically, the portion where the ribbon 143 is not attached to the bus bar electrode 610). Accordingly, the light incident surface can increase at the portion where the ribbon 143 is not attached.

Also, a portion of the second finger electrode 640 adjacent to the intersection 660 with the connecting electrode 630 may be bent (or inclined) at a predetermined angle. Thus, a path from the second finger electrode 640 to the connecting electrodes 630 can decrease. Accordingly, the shading loss can be reduced, and a metal paste used for forming the connecting electrodes 630 and the second finger electrodes 640 can also decrease. In this instance, when the portion of the second finger electrode 640 has the angle of 45 degrees with the connecting electrodes 630, the path from the second finger electrode 640 to the connecting electrodes 630 can be minimized, compared with other angles. Considering a tolerance (or margin of error), the angle between the second finger electrode 640 and the connecting electrode 630 may be in a range of about 40 to about 50 degrees. Other angles may be used, including an angle of 90 degrees.

In addition, the width of the connecting electrode 630 may be changed at some portions. The plurality of the second finger electrodes 640 (that is, two or more second finger electrodes 640) are connected to one connecting electrode 630. Thus, when the connecting electrode 630 is uniform, the internal resistance of the connecting electrode 630 increases as the number of the second finger electrodes 640 connected to the connecting electrode 630 increase. The number of the intersections 660 of the connecting electrode 630 with the second finger electrodes 640 decreases as the distance from the bus bar electrode 610 increases. That is, in order to achieve uniform resistance, the connecting electrode 630 may have a cross section gradually decreasing as the distance from the bus bar electrode 610 increases. In this instance, the connecting electrode 660 has the cross section varying at each of the intersections 660 of the connecting electrodes 630 and the second finger electrodes 640. In embodiments of the invention, a thickness of the connecting electrodes 630 may increase based on the number of connections 660 made with the second finger electrodes 640 in going from the edge of the solar cell to the bus bar electrode 610.

However, embodiments of the invention are not limited thereto. Thus, if some amount of shading loss by the connecting electrodes 630 is acceptable, the connecting electrodes 630 may have a uniform cross section though its entire length. In this instance, the connecting electrodes 630 may have a cross section (which may be predetermined) in a range that the internal resistance of the connecting electrodes 630 does not exceed a predetermined value.

In the embodiment of the invention, the plurality of the second finger electrodes 640 are connected to one connecting electrodes 630. Thus, when a short-circuit is generated at any one portion of the connecting electrodes 630, the electrons-flowing path through the second finger electrodes 640 is blocked. Thus, in order to address the above instance, the plurality of the connecting electrodes 630 (that is, two or more connecting electrodes 630) may be formed. The plurality of connecting electrodes 630 may be formed apart from each other to form a space therebetween. Thus, a space between the connecting electrodes 630 may have an opening 630a, or may have a portion 630b which is open toward an outside. At the space between the connecting electrodes 630, a bridge electrode 650 connecting the connecting electrodes 630 may be formed. Accordingly, when the short-circuit is generated at one connecting electrode 630, the carriers flowing through the second finger electrodes 640 connected to the one connecting electrodes 630 can flow toward the bus bar electrode 610 via the bridge electrode 650 and another connecting electrode 630, so that ultimately, the second finger electrodes 640 connected to the connecting electrode 630 with the short-circuit can be electrically connected to the bus bar electrode 610. That is, the bridge electrode 650 is formed at the space disposed between the adjacent connecting electrodes 630 as an auxiliary electrode. Thus, the problem due to the short-circuit in the connecting electrodes 630 can be addressed.

In this instance, the bridge electrode 650 may be connected to portions of the connecting electrodes 630 that are positioned between two adjacent second finger electrodes 640. Thereby, a problem due to a plurality of electrodes being concentrated at one portion can be addressed. That is, the electrically connected portions can be dispersed, and thus, safety and stability can be improved. In the embodiment of the invention, the connecting electrodes 630 having widths smaller than that of the bus bar electrode 610 are formed at one end of the bus bar electrode 610 where the ribbon 143 is not attached, and thus, an area of a light incident surface can increase at a portion where the ribbon 143 is not attached. Specifically, light can be incident through the opening 630a defined by the bus bar electrode 610, the connecting electrodes 630, and the bridge electrode 650, or the portion 630b open towards the outside between the connecting electrodes 630, and thus, the area of the light incident surface can increase.

In embodiments of the invention, the bridge electrode 650 and the connecting electrodes 630 may have a lattice arrangement. Also, when a plurality of bridge electrodes 650 are used, lengths of the plurality of bridge electrodes 650 may be the same. Additionally, increase in the cross section of the connecting electrode 630 may produce steps that face towards the outside (i.e., face towards the second finger electrodes 640).

FIG. 8 is a plan view of a front electrode according to another embodiment of the invention. As shown in FIG. 8, the front electrode includes a bus bar electrode 710, an auxiliary bus bar electrode 730, connecting electrodes 750, first finger electrodes 720, second finger electrodes 760, and a third finger electrode 740. In this instance, the first finger electrodes 720 are directly connected to the bus bar electrode 710 to have intersections therebetween. The auxiliary bus bar electrode 730 is extended from the bus bar electrode 710 and has a width smaller than the bus bar electrode 710. The third finger electrode 740 is connected to the auxiliary bus bar electrode 730 and is nearer to an edge of the solar cell than the first and second finger electrodes 720 and 760. The third finger electrode 740 is farthest from the bus bar electrode 710 as compared to the first and second finger electrodes 720 and 760. Since the auxiliary bus bar electrode 730 is connected to the third finger electrode 740 that are fewer in number than the first and second finger electrodes 720 and 760, the auxiliary bus bar electrode 730 can have a width smaller than a width of the first bus bar 710. In embodiments of the invention, the auxiliary bus bar electrode 730 may extend parallel to the bus bar electrode 710, but may alternatively extend non-parallel to the bus bar electrode 710. Also, a plurality of auxiliary bus bar electrodes 730 may be connected to the bus bar electrode 710. The third finger electrode 740 may be connected to the auxiliary bus bar electrode 730 in a non-perpendicular manner in other embodiments.

The embodiment of the invention includes the auxiliary bus bar electrode 730 and the third finger electrodes 740 disposed at a space between the connecting electrodes 750 as auxiliary electrodes. That is, a surface area available for light incidence can be sufficiently procured by the space between the connecting electrodes 750, and the current generated at the space between the connecting electrodes 750 can be collected by the auxiliary bus bar electrode 730. The third finger electrodes 740 connected to the bus bar electrode 730 allows the current generated at the space between the connecting electrodes 750 to be collected even more. That is, in the embodiment of the invention, the current generated at the portion between the connecting electrodes 750 can be effectively collected while surface available for light incidence can be sufficiently procured at the portion where the ribbon 143 is not attached.

The auxiliary bus bar electrode 730 and the third finger electrodes 740 may be disposed apart from the connecting electrodes 750 and the second finger electrodes 760 so that the current collected by the auxiliary bus bar electrode 730 and the third finger electrodes 740 can flow to the bus bar electrode 710 through a shortest path.

In FIG. 8, a single third finger electrode 740 is shown as an example. However, embodiments of the invention are not limited thereto. For example, some finger electrodes that are disposed far away from the bus bar electrode 710 may be the third finger electrodes 740. Also, in FIG. 8, the third finger electrode 740 and the auxiliary bus bar electrode 730 form a T shape. In another embodiment of the invention, the third finger electrode 740 may be bent at an intersection with the auxiliary bus bar electrode 730, and thus, the third finger electrode 740 and the auxiliary bus electrode 730 may have a Y shape. In this instance, the path from the third finger electrodes 740 to the auxiliary bus bar electrode 730 can be reduced even more. Also, the third finger electrode 740 and the auxiliary bus electrode 730 may have a cross shape (+).

The second finger electrodes 760 have intersections with the connecting electrodes 750, and are connected to the bus bar electrode 710 through the connecting electrodes 750. The connecting electrodes 750 include a first region 751 having an intersection with the second finger electrodes 760 and a second region 753 connecting the second finger electrodes 760 and the bus bar electrode 710. The first region 751 of the connecting electrodes 750 is apart from the bus bar electrode 710, and the second region 753 is bent toward the bus bar electrode 710. In this instance, when the second region 753 has an angle of 45 degrees with the first region 751 (as in the instance that a distance between one connecting electrode 750 and the bus bar electrode 710, and another distance between another connecting electrode 750 and the bus bar electrode 710 are the same each other), the length of the connecting electrodes 750 can be minimized. Considering a tolerance (or a margin of error), the angle between the second region 753 with the first region 751 may be in a range of about 40 to about 50 degrees. Other angles may be used.

The first region 751 of the connecting electrode 750 has intersections 770 with the plurality of the second finger electrodes 760. The width of the first region 751 may increase as the number of the second finger electrodes 760 connected to the connecting electrodes 750 increases. That is, as the number of the intersections 770 with the second finger electrodes 760 accumulates, the cross section of the connecting electrodes 750 increases, either gradually or in steps. Since the cross section or the thickness of the connecting electrode 750 is adjusted as discussed above, the resistance by the connecting electrodes 750 can be maintained below a predetermined value, regardless of the number of the second finger electrodes 760 connected to the connecting electrodes 750. That is, the first region 751 may have a cross section decreasing as a distance from the bus bar 710 increases. Although not required, the first region 751 of the connecting electrode 750 may be parallel to the bus bar electrode 710, while the second region 753 of the connecting electrode 750 is non-parallel to the bus bar electrode 710.

In addition, the second finger electrodes 760 connected to the connecting electrode 750 may be bent at a portion adjacent to the intersections 770 with the connecting electrodes 750 in order to shorten the path formed by the second finger electrodes 760 to the connecting electrodes 750. In this instance, in order to minimize the path, a bent angle may be about 40 to about 50 degrees (for example, 45 degrees), as discussed above.

FIG. 9 is a plan view of a front electrode according to still another embodiment of the invention. In the embodiment shown in FIG. 9, finger electrodes 830 are directly connected to connecting electrodes 820 or a bus bar electrode 810. In this instance, two connecting electrodes 820 are connected to one bus bar electrode 810. The connecting electrodes 820 may be inclined with respect to the bus bar electrode 810 toward the finger electrodes 830 in a range that lengths of the finger electrodes 830 are not too short. Bent angles, the lengths, and widths of the connecting electrodes 820 may be adjusted considering an amount of a metal paste that is used for forming the front electrode and the efficiency of the solar cell due to an area of the light incident surface.

Unlike the embodiment of the invention described in referring to FIG. 7 and FIG. 8, the finger electrodes 830 are not bent in the embodiment described referring to FIG. 9. Thus, the finger electrodes 830 (specifically, the finger electrodes 830 connected to the connecting electrodes 820) may have a stripe shape. In this instance, because the connecting electrodes 820 are inclined with respect to the bus bar electrode 810, and are bent toward the finger electrodes 830, the length of the finger electrodes 830 can decrease.

Instead of removing the end of the bus bar electrode 810, the connecting electrodes 820 are connected to the finger electrodes 830. Thus, the shading loss due to the bus bar electrode 810 can be reduced or prevented, and the metal paste for forming the electrodes can be reduced. Also, considering a possibility of short-circuit at one of the connecting electrodes 820, a bridge electrode 850 connecting both of the connecting electrodes 820 may be included as an auxiliary electrode. In addition, the cross section of the connecting electrodes 820 may gradually decrease as the distance from the bus bar electrode 810 increases, considering the number of the finger electrodes 830 that are connected to the connecting electrodes 820 is smaller as the distance from the bus bar electrode 810 increases. The cross section of the connecting electrodes 820 may be adjusted by controlling the width or the thickness of the connecting electrodes 820.

In embodiments of the invention, the bridge electrode 850 and the connecting electrodes 820 may have an A shape arrangement. Also, when a plurality of bridge electrodes 850 are used, lengths of the plurality of bridge electrodes 850 may be different. Additionally, increase in the cross section of the connecting electrode 820 may produce steps that face towards the outside (i.e., face towards the finger electrodes 830).

According to the embodiments of the invention, by improving a pattern of a front electrode, the shading loss due to the front electrode formed on the light incident surface of the solar cell can be reduced, and thus, the efficiency of the solar cell can be enhanced. Also, the material cost for forming the front electrode can be also reduced.

Certain embodiments of the invention have been described. However, the invention is not limited to the specific embodiments described above; various modifications of the embodiments are possible by those skilled in the art to which the invention belongs without departing from the scope of the invention defined by the appended claims. Also, modifications of the embodiments should not be understood individually from the technical principles or prospects of the invention.

What is claimed is:

1. A solar cell comprising:
a photoelectric conversion layer; and
a front electrode on the photoelectric conversion layer, wherein the front electrode comprises:
a bus bar electrode;
at least one first finger electrode directly connected to the bus bar electrode;
a plurality of connecting electrodes extending from one end of the bus bar electrode and having a width smaller than a width of the bus bar electrode, wherein the plurality of connecting electrodes includes portions that are spaced apart from each other to form a space therebetween;
at least one second finger electrode connected to at least one of the plurality of connecting electrodes;
an auxiliary electrode formed at the space between the portions of the plurality of connecting electrodes; and
a ribbon on the bus bar electrode,
wherein the plurality of connecting electrodes and the auxiliary electrode are positioned near one end of the ribbon, are positioned in a longitudinal direction of the ribbon, and extend adjacent to an edge of the photoelectric conversion layer parallel to the at least one first finger electrode or the at least one second finger electrode at a space between the one end of the ribbon and the edge of the photoelectric conversion layer,
wherein the at least one second finger electrode comprises a plurality of second finger electrodes connected to one of the plurality of connecting electrodes,
wherein the plurality of connecting electrodes have a cross section varying at intersections of the plurality of connecting electrodes and the plurality of second finger electrodes so that the cross section gradually decreases as a distance from the bus bar electrode increases and as a distance from the edge of the photoelectric conversion layer decreases, and
wherein the auxiliary electrode extends in a direction crossing the at least one first finger electrode or the at least one second finger electrode.

2. The solar cell according to claim 1, wherein the at least one second finger electrode comprises a plurality of second finger electrodes connected to the at least one of the plurality of connecting electrodes, and
the plurality of connecting electrodes have a cross section larger than cross sections of the at least one first finger electrode and the plurality of second finger electrodes.

3. The solar cell according to claim 1, wherein the auxiliary electrode comprises an auxiliary bus bar electrode extending from the bus bar electrode between the plurality of connecting electrodes and having a width smaller than the width of the bus bar electrode.

4. The solar cell according to claim 3, wherein the auxiliary bus bar electrode is spaced apart from the plurality of connecting electrodes and the at least one second finger electrode.

5. The solar cell according to claim 3, further comprising:
a third finger electrode connected to the auxiliary bus bar electrode and being nearer to an edge of the solar cell than the at least one first and the at least one second finger electrodes.

6. The solar cell according to claim 5, wherein the third finger electrode includes a part connected to the auxiliary bus bar electrode and bent towards the bus bar electrode, and
the auxiliary bus bar electrode and the third finger electrode form a Y shape.

7. The solar cell according to claim 5, wherein the third finger electrode is parallel to the at least one first finger electrode.

8. The solar cell according to claim 1, wherein the plurality of connecting electrodes comprise a first region having an intersection with the second finger electrode and a second region being bent towards the bus bar electrode.

9. The solar cell according to claim 8, wherein the first region has a cross section that gradually decreases as a distance from the bus bar electrode increases.

10. The solar cell according to claim 1, wherein the plurality of connecting electrodes are inclined with respect to the bus bar electrode.

11. The solar cell according to claim 10, wherein the plurality of connecting electrodes and the bus bar electrode form a Y shape.

12. The solar cell according to claim 10, wherein the plurality of connecting electrodes have an angle of about 40 to about 50 degrees with respect to the bus bar electrode.

13. The solar cell according to claim 1, wherein the at least one second finger electrode comprises a plurality of second finger electrodes connected to the at least one of the plurality of connecting electrodes, and the plurality of second finger electrodes have a stripe shape.

14. The solar cell according to claim 1, wherein the space between the plurality of connecting electrodes has an opening, or has a portion which is open towards an outside.

15. A solar cell comprising:
a photoelectric conversion layer; and
a front electrode on the photoelectric conversion layer, wherein the front electrode comprises:
a bus bar electrode;
at least one first finger electrode directly connected to the bus bar electrode;
a plurality of connecting electrodes extending from one end of the bus bar electrode and having a width smaller than a width of the bus bar electrode, wherein the plurality of connecting electrodes includes portions that are spaced apart from each other to form a space therebetween;
at least one second finger electrode connected to at least one of the plurality of connecting electrodes;
an auxiliary electrode formed at the space between the portions of the plurality of connecting electrodes;
at least one third finger electrode connected to the auxiliary electrode in a direction crossing the auxiliary electrode;
a ribbon on the bus bar electrode;
wherein the plurality of connecting electrodes, the auxiliary electrode and the at least one third finger electrode are positioned near one end of the ribbon, are positioned in a longitudinal direction of the ribbon, and extend adjacent to an edge of the photoelectric conversion layer parallel to the at least one first finger electrode or the at least one second finger electrode at a space between the one end of the ribbon and the edge of the photoelectric conversion layer, and
wherein the auxiliary electrode extends in a direction crossing the at least one first finger electrode and the at least one second finger electrode.

16. The solar cell according to claim 15, wherein the at least one second finger electrode comprises a plurality of second finger electrodes connected to one of the plurality of connecting electrodes, and wherein the plurality of connecting electrodes have a cross section varying at intersections of the plurality of connecting electrodes and the plurality of second finger electrodes so that the cross section decreases at the intersections as a distance from the bus bar electrode increases and as a distance from the edge of the photoelectric conversion layer decreases, and each of portions between the cross sections has a uniform cross section.

* * * * *